US007060583B2

(12) United States Patent
Kriz et al.

(10) Patent No.: US 7,060,583 B2
(45) Date of Patent: Jun. 13, 2006

(54) METHOD FOR MANUFACTURING A BIPOLAR TRANSISTOR HAVING A POLYSILICON EMITTER

(75) Inventors: Jakob Kriz, Winböhla (DE); Martin Seck, Munich (DE); Armin Tilke, Dresden (DE)

(73) Assignee: Infineon Technologies AG, Munich (DE)

( * ) Notice: Subject to any disclaimer, the term of this patent is extended or adjusted under 35 U.S.C. 154(b) by 235 days.

(21) Appl. No.: 10/757,360

(22) Filed: Jan. 13, 2004

(65) Prior Publication Data

US 2004/0185631 A1   Sep. 23, 2004

Related U.S. Application Data

(63) Continuation of application No. PCT/EP02/08234, filed on Jul. 10, 2002.

(30) Foreign Application Priority Data

Jul. 13, 2001   (DE) ................. 101 34 089

(51) Int. Cl.
*H01L 21/331*   (2006.01)
*H01L 21/8222*   (2006.01)
(52) U.S. Cl. .............. 438/309; 438/340; 438/342; 438/343
(58) Field of Classification Search ........... 438/309, 438/340, 342–343
See application file for complete search history.

(56) References Cited

U.S. PATENT DOCUMENTS 5,001,533 A   3/1991   Yamaguchi
5,185,276 A *   2/1993   Chen et al. ............. 438/309
5,204,276 A *   4/1993   Nakajima et al. ........... 438/366

(Continued)

FOREIGN PATENT DOCUMENTS

CA   01 201 218   2/1986

(Continued)

OTHER PUBLICATIONS

Pontcharra, de Jean, et al., "A 30-GHz $f_\tau$ Quasi-Self-Aligned Single-Poly Bipolar Technology", IEEE Transactions on Electron Devices, New York US, Nov. 1, 1997, vol. 44, No. 11, pp. 2091-2906, (6 pages).

(Continued)

*Primary Examiner*—Chuong Anh Luu
(74) *Attorney, Agent, or Firm*—Maginot, Moore & Beck

(57) ABSTRACT

In the inventive method for manufacturing a bipolar transistor having a polysilicon emitter, a collector region of a first conductivity type and, adjoining thereto, a basis region of a second conductivity type will be generated at first. At least one layer of an insulating material will now be applied, wherein the at least one layer is patterned such that at least one section of the basis region is exposed. Next, a layer of a polycrystalline semiconductor material of the first conductivity type, which is heavily doped with doping atoms, will be generated such that the exposed section is essentially covered. Now, a second layer of a highly conductive material on the layer of the polycrystalline semiconductor material will be generated in order to form an emitter double layer with the same. Thereupon, at least part of the doping atoms of the first conductivity type of the heavily doped polycrystalline semiconductor layer is caused to get into the basis region to generate an emitter region of the first conductivity type.

4 Claims, 1 Drawing Sheet

U.S. PATENT DOCUMENTS

| | | | |
|---|---|---|---|
| 5,504,018 A * | 4/1996 | Sato | 438/350 |
| 5,587,326 A | 12/1996 | Takemura | |
| 5,986,326 A * | 11/1999 | Kato | 257/593 |
| 5,994,196 A * | 11/1999 | Seog | 438/370 |
| 6,004,855 A * | 12/1999 | Pollock et al. | 438/342 |
| 6,180,442 B1 * | 1/2001 | Gris | 438/202 |
| 6,211,029 B1 * | 4/2001 | Kinoshita | 438/357 |
| 6,319,786 B1 | 11/2001 | Gris | |
| 6,440,810 B1 * | 8/2002 | Johansson et al. | 438/309 |
| 6,455,364 B1 * | 9/2002 | Asai et al. | 438/235 |
| 6,482,710 B2 * | 11/2002 | Oda et al. | 438/311 |
| 2001/0003667 A1 * | 6/2001 | Ahn et al. | 438/344 |
| 2001/0005035 A1 | 6/2001 | Kinoshita | |
| 2001/0009793 A1 * | 7/2001 | Sato | 438/342 |

FOREIGN PATENT DOCUMENTS

| | | |
|---|---|---|
| DE | 3304642 A1 | 8/1984 |
| DE | 3940674 A1 | 6/1990 |
| FR | 2795233 A1 | 6/1999 |

OTHER PUBLICATIONS

Sugiyama, M. et al., "A 40 GH $f_\tau$ Si Bipolar Transistor LSI Technology", Proceedings of the International Electron Devices Meeting, Washington, Dec. 3-6, 1989, New York US, Dec. 3, 1989, pp. 221-224, (4 pages).

Aoyama T. et al., "Selective Polysilicon Deposition (SPD) by Hot-Wall LPCVD and its Application to High Speed Bipolar Devices", Japanese Journal of Applied Physics, Tokyo, Japan 1990, pp. 665-668, (4 pages).

Burghartz J. N. et al., "Novel In-Situ Doped Polysilicon Emitter Process with Buried Diffusion Source (BDS)", IEEE Electron Device Letters, vol. 12, No. 12, New York US, Dec. 1991, pp. 679-681, (3 pages).

Selvakumar, C. R., "Theoretical and Experimental Aspects of Polysilicon Emitter Bipolar Transistors", IEEE, Nov. 16, 1988, pp. 3-16, (14 pages).

* cited by examiner

METHOD FOR MANUFACTURING A BIPOLAR TRANSISTOR HAVING A POLYSILICON EMITTER

CROSS-REFERENCE TO RELATED APPLICATION

This application is a continuation of copending International Application No. PCT/EP02/08234, filed Jul. 10, 2002, which designated the United States and was not published in English.

BACKGROUND OF THE INVENTION

1. Field of the Invention

The present invention relates to the manufacture of semiconductor devices and, in particular, to the manufacture of bipolar transistors having a polysilicon emitter, which comprise reduced emitter resistance.

2. Description of Prior Art

In bipolar transistors, which are designed to take high powers and speeds, use is already made of polysilicon emitters. In this connection, with respect to the theoretical and experimental aspects of the use of bipolar transistors having a polysilicon emitter, reference is made to the article by C. R. Selvakumar, "Theoretical and Experimental Aspects of Polysilicon Emitter Bipolar Transistors", published in IEEE Press, 1988, pages 3 to 16.

Therefore, one embodiment of a bipolar transistor having a polysilicon emitter provides a heavily doped polysilicon layer located above the basis, which serves both as a diffusion source for the generation of a flat (emitter/basis) semiconductor transition and as a means for contacting the flat emitter region. After performing the conventional processing steps for manufacturing the basis region and the emitter window openings, either non-doped or doped polysilicon will be applied, into which, if the polysilicon is non-doped, an exact quantity of arsenic atoms will be implanted. Thereupon, by way of heat treatment (tempering), damages will be annealed, and the emitter/basis semiconductor transition is formed.

As can be seen from the above-cited article on page 4, one of the critical processing steps in the manufacture of bipolar transistors having polysilicon emitters consists of the treatment of the waver exactly before applying the polysilicon. Therefore, the many different treatment methods, as are known in the state of the art, may be roughly sub-divided into two categories. The first treatment refers to intentional or unintentional growth of a thin oxide layer (0.2 to 2 nm). The second treatment refers to the epitaxial growth of a thin thermal nitride layer (approximately 1.0 to 1.5 nm). The "interface" treatment is important, since the same has strong effects on the electrical characteristics of bipolar transistors having a polysilicon emitter.

As has been mentioned above in brief, it is tried to achieve bipolar transistors having high cut-off frequencies and high current gains by forming the emitter(s) of a bipolar transistor by depositing a heavily doped polysilicon layer. The doping agent in the polysilicon layer will then diffuse, by way of tempering, from the polysilicon layer into the single crystal silicon substrate below, where it forms the electrically-active emitter area of the bipolar transistor. Here, the polysilicon used serves as a doping agent source, as a feed and also as a landing surface for the contact terminal holes yet to be formed. As for the operational properties of the transistor, the use of polysilicon has the following decisive advantage that the interface between the polysilicon layer and the single crystal silicon substrate serves as a diffusion barrier for minority carriers which are injected from the basis, thus clearly increasing current gain and cut-off frequency of the transistor.

However, one disadvantage of polysilicon is the specific resistance which is by orders of magnitude higher as compared to metals. The relatively high emitter resistance resulting therefrom especially affects the high-frequency properties of the bipolar transistors. Owing to these problems, it has been tried to use as thin a polysilicon layer as possible. On the other hand, a certain minimum thickness of mostly far above 100 nm is required, since an etching of contacting holes for the contact pads has to stop on this polysilicon layer in order to ensure the process safety during the manufacture of bipolar transistors. The problem concerning the emitter resistance still increases with modern bipolar transistors having very narrow emitter windows, since the polysilicon used may completely fill the emitter window in this case, and, thus, the height of the polysilicon layer over the active emitter further increase It should be appreciated that, instead of polysilicon, an amorphous silicon may also be used which, in turn, may rest to crystallize in subsequent tempering processes.

In order to solve the problems shown above concerning the manufacture of bipolar transistors having a polysilicon emitter, concepts haven been taken up, which provide a thermal silicidation of the emitter after depositing a metal layer. Silicides are metal/silicon compounds, which are used in silicon technology as temperature-stable, low-resistance traces and contacts. The silicide layers typically provide a thickness of 0.1 to 0.2 μm. However, the silicide layer formed in this manner is, as a rule, relatively irregular, thus, in practice, making it impossible to fill the emitter window with this layer.

As a further measure, the layer thickness of the polysilicon was kept as low as possible and the doping of same was kept as high as possible. If possible, filling the emitter window with polysilicon was avoided, which, however, in earlier technologies, was much easier owing to larger emitter dimensions. If, after depositing the polysilicon on the emitter, a very narrow gap is left, increased efforts were necessary, depending on the technology chosen, when etching the contacting holes, since this gap may be filled with an undesired material, e.g. with a nitride barrier, when depositing further layers.

In many cases, the negative influence of the emitter resistor on the transistor properties was simply accepted and/or it was tried to compensate for this negative influence in terms of circuit technology.

SUMMARY OF THE INVENTION

It is the object of the present invention to provide an improved method for manufacturing a bipolar transistor having a polysilicon emitter whose emitter resistance is clearly reduced in order to improve the electrical properties of the bipolar transistor.

In accordance with a first aspect, the invention provides method for manufacturing a bipolar transistor having a polysilicon emitter, having the following steps: generating a collector region of a first conductivity type and a basis region of a second conductivity type adjoining thereto in a semiconductor substrate; applying a polycrystalline layer of a polycrystalline semiconductor material of the second conductivity type heavily doped with doping atoms on the substrate, so that a portion of the basis region is exposed; applying at least one insulating layer of an insulating material on the polycrystalline layer; patterning the at least one insulating layer such that at least one section of the basis region is exposed; generating a further polycrystalline layer of a polycrystalline semiconductor material of the first conductivity type heavily doped with a doping atom such that the exposed section is essentially covered, wherein the polycrystalline layer and the further polycrystalline layer are isolated by the insulating layer; generating a highly conductive layer of a highly conductive material on the further polycrystalline layer to generate an emitter double layer with the same; effecting that at least part of the doping atoms of the second conductivity type of the polycrystalline layer get into the semiconductor substrate to electrically connect the base region to the polycrystalline layer; effecting that at least part of the doping atoms of the first conductivity type of the heavily doped further polycrystalline layer get into the basis region to generate an emitter region of the first conductivity type; structuring the emitter double layer for generating an emitter terminal area; contacting the emitter terminal area with an contact terminal.

The present invention is based on the recognition that, by forming an emitter double layer during the manufacture of a bipolar transistor having a polysilicon emitter, the specific resistance of the emitter terminal will be reduced and, thus, the electrical characteristics of the device will significantly improve with the present invention, the emitter of the bipolar transistor will be deposited in two stages. Here, the first layer consists of a common, heavily doped polysilicon material. This polysilicon layer now still only serves as source for the doping material and for generating a polysilicon single crystalline interface between a polysilicon layer and the single crystal semiconductor material of the substrate. As a result, the polysilicon layer used may be selected significantly thinner as has been the case so far. The second layer applied is a layer of a highly conductive material, by way of which the lead resistance to the emitter of the bipolar transistor is kept at a low level. This highly conductive layer further serves as a stop layer for the etching of the contacting holes to be performed for the various contact pads. This layer may completely fill the emitter window without having any considerably negative effect on the emitter resistance, i.e. without the emitter resistance being increased.

This second highly conductive layer has to sustain the high temperatures of emitter tempering (of the temperature treatment) of typically about 1000° C. or higher and, for reasons based on the manufacturing technology, should further provide properties similar to the silicon material used in the various manufacturing processes, such as e.g. in dry etching processes.

By way of the inventive method for manufacturing a bipolar transistor having a polysilicon emitter, in which a two-layer emitter deposition is provided in order to form an emitter double layer, which ensures an extremely low emitter resistance, extremely favourable electrically characteristics of the transistor may thus be achieved. As a result, the reduction in the emitter resistance achieved by the deposited emitter double layer has a positive impact on the cut-off frequency and, in general, also on the voltage and power gain in a circuit.

As already noted, the first, lower layer consists of a polysilicon material, which is effective as a doping agent source for the active transistor region, wherein the second, upper layer consists of a highly conductive material, which serves as an etch stopping means for etching the contacting holes of the contact pads as well as for the vertical current transport between the contact pads and the silicon emitter.

BRIEF DESCRIPTION OF THE DRAWINGS

These and other object and features of the present invention will become clear from the following description taken in conjunction with the accompanying drawing, in which.

DESCRIPTION OF THE PREFERRED EMBODIMENTS

Figure 1:
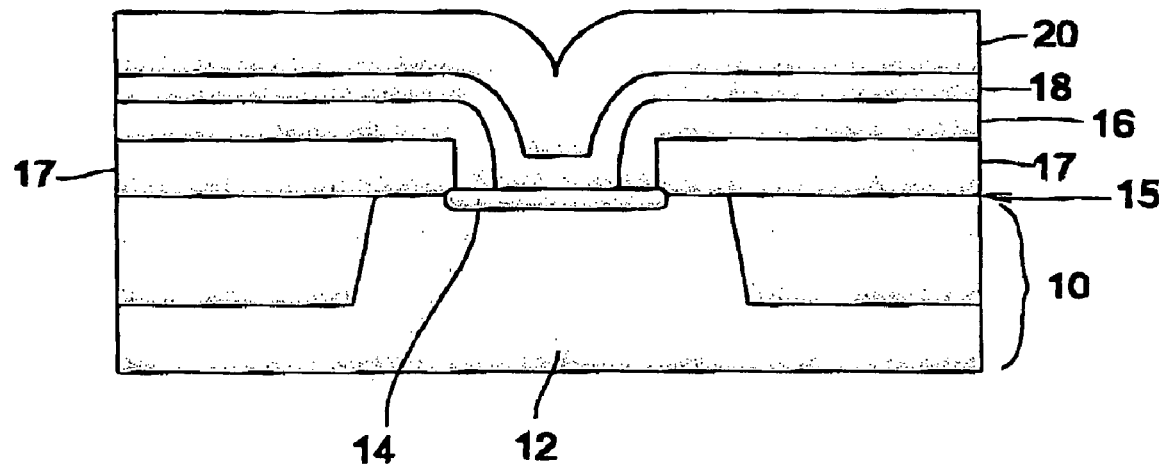
FIG. 1 shows an interim state of the manufacturing process of a bipolar transistor having a polysilicon emitter having a narrow emitter window after depositing the emitter polysilicon material and the silicide layer.
Figure 2:
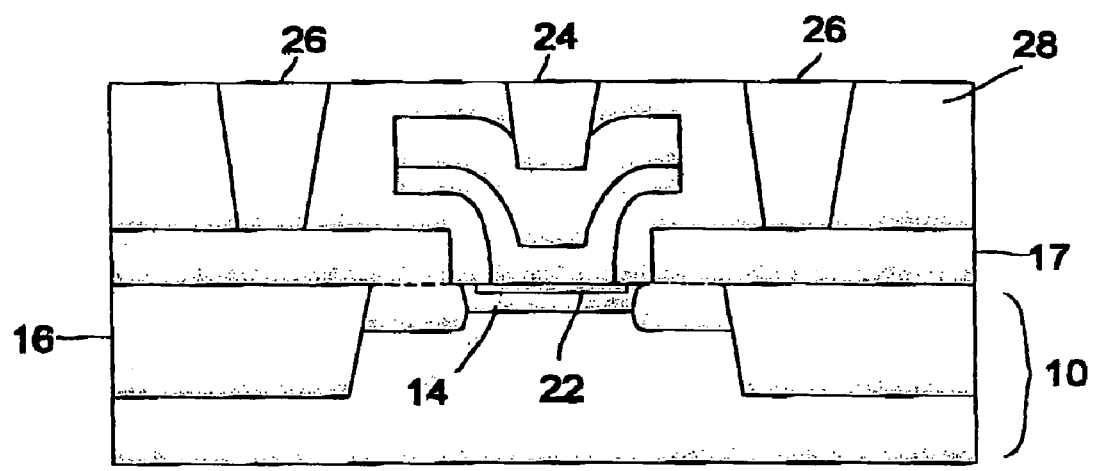
FIG. 2 shows the state of the manufacturing process of a bipolar transistor having a polysilicon emitter having a narrow emitter window after patterning the emitter double layer, after tempering and contacting.

With reference to FIGS. 1 and 2, a preferred embodiment of the present invention for manufacturing a bipolar transistor having a polysilicon emitter will now be explained in detail.

As shown in FIG. 1, preferably, a single crystal silicon body is used, which serves as a substrate 10 for the bipolar transistor. In the substrate 10, a first region 12 of a first conductivity type is formed, with this region 12 being referred to as a collector region below. In the substrate 10, a further region 14 of a second conductivity type is further formed, which is herein referred to as a basis region 14 below.

In connection with the present invention, the first conductivity type designates a so-called n-type doping, while the second conductivity type designates a so-called p-type doping. A doping in a semiconductor material is referred to as a n-type, if the majority charge carriers therein are electrons, wherein a doping in a semiconductor material is referred to as a p-type, if the majority charge carriers therein are holes. In the present invention the conductivity types of the dopings may each be selected vice versa.

The basis region 14 adjoins the collector region 12, wherein at least one section of the basis region 14 is formed between the surface 15 of the substrate 10 and the collector region 12. On the surface of the substrate 10, a polycrystalline layer 17, e.g. of polysilicon, will be applied in an appropriate manner, which provides the second conductivity type (p-type), wherein the basis region 14 in the substrate 10 remains essentially exposed. In the following, this layer 17 serves as a p-doped basis terminal area for the basis region 14.

On the surface of the substrate 10 or therein, one or more layers 16 of a material, e.g. a dielectric (insulating) material, are formed, wherein the dielectric layers are patterned such that at least one section of the basis region 14 is exposed.

Next, a layer 18 of a polycrystalline semi-material, preferably silicone, will be applied such that this polysilicon layer 18 essentially covers the exposed section of the basis region 14.

Since non-doped polysilicon layers provide a very high resistance (approximately $10^4$ Ωcm), in the present case, the polysilicon layer 18, since the same has an electrically conductive function in the transistor, will be provided with doping agents, e.g. boron, phosphor or arsenic, in order to achieve the respective doping type, the desired doping strength and, thus, the desired electrically conductivity of the polysilicon layer. In order to save an additional doping step, the doping of the polysilicon layer 18 is generally achieved during the polysilicon deposition by adding suitable materials. In the present case, the polysilicon layer 18 comprises the first conductivity type (n-type).

With the present invention, an already heavily doped polysilicon material is preferably applied, since a further, second layer 20 of a highly conductive material will be applied directly onto the existing polysilicon layer 18, in order to form, together with the polysilicon layer 18, a so-called emitter double layer. The second layer 20 consisting of a highly conductive material is normally a silicide layer. Silicides are metal/silicone compounds, which are used as temperature-stable low-resistance materials in silicone technology. These suicide layers typically provide a thickness of 0.1 to 0.2 µm, wherein a thickness of 0.1 to 0.2 µm refers to the thickness deposited on regular faces. Therefore, in the emitter window, the thickness or height of the silicide layer lies clearly above 0.2 µm, e.g. at 0.5 µm. Most frequently, silicides such as $MoSi_2$ or $WSi_2$ are used.

For the explanation of the further steps of the inventive method for manufacturing a bipolar transistor having a polysilicon emitter, reference is now made to FIG. 2. The present semiconductor structure will now be subjected to a temperature treatment (tempering), such that at least some of the doping agents from the heavily doped polysilicon layer 18 diffuse into the single crystal body, i.e. into the substrate 10. As a result, the active emitter area 22 forms in the substrate, i.e. especially adjacent to the basis area 14. Thus, at least some part of the doping atoms of the first conductivity type of the heavily doped polysilicon layer 18 gets into the substrate, to generate, adjacent to the basis region 14 in the substrate 10, an active emitter region 22 of the first conductivity type. The active emitter region 22 extends from the interface 15, between the polysilicon layer 18 and the substrate 10, into the semiconductor material of substrate 10.

Furthermore, during temperature treatment, some part of the doping atoms of the second conductivity type of the polysilicon layer 17, which is doped with this second conductivity type and which has been provided for the basis terminals 15, gets into the substrate 10, with a large-surface connection to the basis region 14 in the substrate 10 resulting therefrom.

The term temperature treatment, or tempering, in silicon technology refers to the treatment of silicon at increased temperatures in an inert atmosphere, e.g. nitrogen, argon, hydrogen, and forming gas. As a result, no new layers are grown and no material will be removed, but the layers already existing and the silicon substrate itself will be subjected to decisive changes. In the present case, the doping agents of the first or second conductivity type of the various, differently doped polysilicon layers 17, 18 get into the adjoining semiconductor material of the semiconductor substrate 10.

Next, the emitter double layer consisting of the polysilicon layer 18 and the highly conductive second layer 20 will be patterned to generate an emitter terminal area of the bipolar transistor. Patterning is usually effected by dry etching of the respective layers. Processing is facilitated, if the upper, highly conductive silicide layer 20 essentially comprises the same or comparative processing properties, e.g. etching properties, such as the polysilicon layer 18.

The exposed sections on the remaining present semiconductor structure are now usually filled with an encapsulating insulating material 28. Further, the so-called contacting holes will be etched in order to provide the contact terminal 24 for the emitter terminal area and the contact terminals 26 for the basis terminal area 17. In the emitter terminal area, the silicide layer 20 serves as an etch stopping means for etching the contacting holes.

By way of the above-described inventive manufacture of a bipolar transistor having a polysilicon emitter, it is possible to clearly reduce the specific resistance of the emitter terminal area, whereby the electrical characteristics of a bipolar transistor may be considerably improved. As a result, the reduction in the emitter resistance achieved by way of the emitter double layer deposited has a positive effect on the cut-off frequency and, in general, also on the voltage and power gain in a circuit.

The inventive, advantageous concept for manufacturing a bipolar transistor having a polysilicon emitter essentially comprises the step of performing the deposition of the emitter terminal area in two stages. As a result, the first layer 18 consists of the usual heavily doped polysilicon material. In the present invention, it merely serves as a source for the doping agent and for generating the polysilicon single crystal interface and may, therefore, be selected thinner than before. The second layer 20 is a layer of a highly conductive material which keeps the lead resistance at a low level and which serves as a stopping layer for etching the contacting holes. It can fill the emitter window without significantly increasing the emitter resistance. In the preferred processing, this second layer 20 has to sustain the high temperatures of emitter tempering, which are typically about 1000° C. or more, and, for simplifying the processing in dry etching processes, may provide comparative properties such as the silicone material.

In principal, a type of processing is also conceivable in which emitter tempering occurs before depositing the second layer. When depositing the second layer, both pure metals and metal silicon compounds (silicides) are ideal, wherein, in particular, all silicides of high-melting-point metals, such as e.g. tungsten-disilicide and molybdenum-disilicide, are used. For other materials, such as e.g. tungsten, an additional deposition of a diffusion barrier may be necessary.

In the inventive method for manufacturing a bipolar transistor having a polysilicon emitter, a two-stage emitter deposition will be performed in accordance with the invention, with the lower layer of polysilicon being effective as a doping agent source for the active transistor region and the upper highly conductive layer being effective as an etch stopping means for etching the contacting holes and also for the vertical current transport between the contacting hole and the polysilicon emitter.

Further, it should be appreciated that the present invention is also applicable to deviating transistor architectures, in particular, those having an epitaxially grown basis area. Therefore, there are transistor architectures, in which the basis area and sometimes also part of the collector area are epitatically grown onto the substrate. In these architectures, which, in the future, are very likely to be used more frequently, the inventive emitter double layer may also be used in an advantageous manner.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. Method for manufacturing a bipolar transistor having a polysilicon emitter, comprising:

generating a collector region of a first conductivity type and a basis region of a second conductivity type adjoining thereto in a semiconductor substrate;

applying a polycrystalline layer of a polycrystalline semiconductor material of the second conductivity type doped with doping atoms on the substrate, so that a portion of the basis region is exposed;

applying at least one insulating layer of an insulating material on the polycrystalline layer;

patterning the at least one insulating layer such that at least one section of the basis region is exposed;

generating a further polycrystalline layer of a polycrystalline semiconductor material of the first conductivity type heavily doped with doping atoms such that the exposed section is essentially covered, wherein the polycrystalline layer and the further polycrystalline layer are isolated by the insulating layer;

generating a highly conductive layer of a highly conductive material on the further polycrystalline layer to form an emitter double layer with the same;

effecting, via a temperature treatment, that at least part of the doping atoms of the second conductivity type of the polycrystalline layer get into the semiconductor substrate to electrically connect the base region to the polycrystalline layer;

effecting that at least part of the doping atoms of the first conductivity type of the heavily doped further polycrystalline layer get into the basis region to generate an emitter region of the first conductivity type;

structuring the emitter double layer for generating an emitter terminal area;

contacting the emitter terminal area with an contact terminal, wherein the layer and the contact terminal vary, comprising the following substeps:

applying an insulating material on the emitter terminal area; and etching a contact via into the insulating material, wherein the highly conductive layer in the emitter terminal area is effective as stop layer for the via etching.

2. Method in accordance with claim 1, wherein the step of effecting that at least part of the doping atoms of the first conductivity type of the heavily doped further polycristalline layer gets into the basis region, will be performed by means of tempering.

3. Method in accordance with claim 1, wherein the highly conductive layer consists of a material having comparative processing properties as the semiconductor material.

4. Method in accordance with claim 1, wherein the step of effecting that at least part of the doping atoms of the first conductivity type of the heavily doped further polycrystalline layer get into the basis region will be performed before or after the step of generating the highly conductive layer.

* * * * *